US011994549B1

(12) United States Patent
Steinberg et al.

(10) Patent No.: US 11,994,549 B1
(45) Date of Patent: May 28, 2024

(54) METHOD AND SYSTEM TO DETERMINE RADIO FREQUENCY ANTENNA ELECTROMAGNETIC FIELD SPATIAL DISTRIBUTION

(71) Applicant: ENDRA Life Sciences Inc., Ann Arbor, MI (US)

(72) Inventors: Idan Steinberg, Superior Charter Township, MI (US); Michael M. Thornton, London (CA); Christopher Nelson Davis, Ann Arbor, MI (US); Jang Hwan Cho, Ann Arbor, MI (US)

( * ) Notice: Subject to any disclaimer, the term of this patent is extended or adjusted under 35 U.S.C. 154(b) by 0 days.

(21) Appl. No.: 18/401,526

(22) Filed: Dec. 31, 2023

(51) Int. Cl.
| | |
|---|---|
| A61B 5/00 | (2006.01) |
| A61B 8/00 | (2006.01) |
| G01R 29/08 | (2006.01) |
| G01R 29/10 | (2006.01) |

(52) U.S. Cl.
CPC ......... G01R 29/10 (2013.01); G01R 29/0821 (2013.01); G01R 29/0878 (2013.01)

(58) Field of Classification Search
CPC  G01R 29/08; G01R 29/0821; G01R 29/0878; G01R 29/10; H01P 11/00; A61B 5/00; A61B 5/05; A61B 8/00
See application file for complete search history.

(56) References Cited

U.S. PATENT DOCUMENTS

| | | | | |
|---|---|---|---|---|
| 5,713,356 A | * | 2/1998 | Kruger ................. | A61B 8/4281 600/407 |
| 7,266,407 B2 | * | 9/2007 | Li ....................... | A61B 5/0507 600/430 |
| 8,954,293 B2 | * | 2/2015 | Klinkenbusch .......... | A61B 5/30 343/893 |
| 9,351,705 B2 | * | 5/2016 | Wang ................... | A61B 8/4461 |
| 10,564,201 B1 | * | 2/2020 | Shaffer ................. | G01R 29/10 |
| 10,653,321 B2 | * | 5/2020 | Wang ................... | A61B 8/4245 |
| 10,682,059 B1 | | 6/2020 | Davis et al. | |
| 10,750,950 B2 | * | 8/2020 | Kellnberger ......... | A61B 5/7257 |
| 11,304,606 B2 | | 4/2022 | Davis et al. | |
| 11,337,676 B2 | | 5/2022 | Barnes et al. | |

(Continued)

OTHER PUBLICATIONS

Sergey Vilov, Guillaume Godefroy, Bastien Arnal, and Emmanuel Bossy; "Photoacoustic fluctuation imaging: theory and application to blood flow imaging"; Optica vol. 7, No. 11 / Nov. 2020 /pp. 1495-1505; revised Sep. 11, 2020; accepted Sep. 14, 2020 (Doc. ID 400517); published Oct. 27, 2020; https://doi.org/10.1364/OPTICA.400517.

*Primary Examiner* — Tho G Phan
(74) *Attorney, Agent, or Firm* — Stanley E. Jelic

(57) ABSTRACT

A method for determining an electromagnetic field spatial distribution of a radio frequency (RF) antenna which includes the steps of emitting with the RF antenna, a plurality of RF energy pulses into a homogeneous medium; performing a plurality of thermoacoustic signal measurements of the plurality of RF energy pulses, wherein each of the thermoacoustic signal measurements is performed in a similar manner; utilizing a variance in the plurality of thermoacoustic signal measurements to generate a reconstructed pressure distribution for a volume located within the homogeneous medium; and calculating the RF antenna electromagnetic field spatial distribution within the volume based upon the reconstructed pressure distribution for the volume located within the homogeneous medium.

20 Claims, 5 Drawing Sheets

(56) References Cited

U.S. PATENT DOCUMENTS

| | | |
|---|---|---|
| 11,369,272 B1 | 6/2022 | Davis et al. |
| 11,619,613 B1 | 4/2023 | Davis et al. |
| 11,730,374 B1 | 8/2023 | Sengenberger et al. |
| 11,844,650 B1 | 12/2023 | Davis et al. |

* cited by examiner

METHOD AND SYSTEM TO DETERMINE RADIO FREQUENCY ANTENNA ELECTROMAGNETIC FIELD SPATIAL DISTRIBUTION

FIELD

The subject disclosure relates to thermoacoustic imaging and in particular, to a method and system for determining a radio frequency antenna's electromagnetic field spatial distribution.

BACKGROUND

Determining the spatial distribution of the electromagnetic field generated by an antenna is essential for determining and optimizing its performance, ensuring compatibility with other systems, complying with regulations, and facilitating research and development in the field of antenna technology. However, proper characterization of the full three-dimensional distribution of an antenna, especially in the near-field regime, is complicated and costly as field probes only measure the field in a single spatial location and will perturb the field if used too close to the antenna due to their metallic bodies. Many discrete measurements may be needed, which may be possible for distances far from an antenna. But in applications where a patient may be close or even touching the antenna, it may not be feasible to obtain the measurements.

SUMMARY

There is a desire to provide a method for near-field antenna characterization in a homogeneous medium. The homogenous medium can be a liquid, such as water, human or animal tissue, or a phantom material designed to mimic the characteristics of tissue (in particular having the same electrical permittivity as tissue).

Accordingly, in one aspect there is provided a method for determining an electromagnetic field spatial distribution of a radio frequency (RF) antenna, the method comprising: (i) emitting with the RF antenna, a plurality of RF energy pulses into a homogeneous medium; (ii) performing a plurality of thermoacoustic signal measurements of the plurality of RF energy pulses, wherein each of the thermoacoustic signal measurements is performed in a similar manner; (iii) utilizing a variance in the plurality of thermoacoustic signal measurements to generate a reconstructed pressure distribution for a volume located within the homogeneous medium; and (iv) calculating the RF antenna electromagnetic field spatial distribution within the volume based upon the reconstructed pressure distribution for the volume located within the homogeneous medium.

The plurality of thermoacoustic signal measurements may be performed with a thermoacoustic system comprising the RF antenna and one or more thermoacoustic transducers.

The homogeneous medium may be a liquid. For example, the liquid may be water.

The homogenous medium may have a relative permittivity between 2 and 90. Air has a relative permittivity of 1. Tissue permittivity at 434 MHz is between 10 and 70 depending upon the tissue type (e.g., liver tissue is approximately 50 but can vary depending upon the amount of fat in the liver, blood is approximately 64).

In one embodiment, the homogeneous medium may be a solid.

In another embodiment, a method for determining an electromagnetic field spatial distribution of a radio frequency (RF) antenna may comprise (i) emitting, by the RF antenna, a plurality of RF energy pulses into a homogeneous medium; (ii) performing, by at least one processor, a plurality of thermoacoustic signal measurements of the plurality of RF energy pulses, wherein each of the thermoacoustic signal measurements is performed in a similar manner; (iii) generating, by the at least one processor, a reconstructed pressure distribution for a volume located within the homogeneous medium using a variance in the plurality of thermoacoustic signal measurements; and (iv) generating, by the at least one processor, a representation of the RF antenna electromagnetic field spatial distribution within the volume based upon a calculation using the reconstructed pressure distribution for the volume located within the homogeneous medium.

The representation is a two dimensional or three dimensional visual representation of the RF antenna electromagnetic field spatial distribution.

In another embodiment, a system for determining an electromagnetic field spatial distribution of a radio frequency (RF) antenna may comprise an RF antenna configured to emit a plurality of RF energy pulses into a homogeneous medium; and at least one processor configured to: perform a plurality of thermoacoustic signal measurements of the plurality of RF energy pulses, wherein each of the thermoacoustic signal measurements is performed in a similar manner; generate a reconstructed pressure distribution for a volume located within the homogeneous medium using a variance in the plurality of thermoacoustic signal measurements; and generate a representation of the RF antenna electromagnetic field spatial distribution within the volume based upon a calculation using the reconstructed pressure distribution for the volume located within the homogeneous medium.

The system may further comprise one or more thermoacoustic transducers.

In yet another embodiment, a non-transitory machine-readable storage medium having computer-executable instructions stored thereon that, when executed by one or more processors, cause the one or more processors to perform operations comprising performing, by at least one processor, a plurality of thermoacoustic signal measurements of a plurality of RF energy pulses emitted by an RF antenna, wherein each of the thermoacoustic signal measurements is performed in a similar manner; generating, by the at least one processor, a reconstructed pressure distribution for a volume located within the homogeneous medium using a variance in the plurality of thermoacoustic signal measurements; and generating, by the at least one processor, a representation of the RF antenna electromagnetic field spatial distribution within the volume based upon a calculation using the reconstructed pressure distribution for the volume located within the homogeneous medium.

The plurality of thermoacoustic signal measurements may be performed with a thermoacoustic system comprising the non-transitory machine-readable storage medium, the RF antenna, and one or more thermoacoustic transducers.

It should be appreciated that this summary is provided to introduce a selection of concepts in a simplified form that are further described below in the detailed description. This summary is not intended to be used to limit the scope of the claimed subject matter.

BRIEF DESCRIPTION OF THE DRAWINGS

Embodiments will now be described more fully with reference to the accompanying drawings in which.

DETAILED DESCRIPTION OF THE EMBODIMENTS

Figure 1:
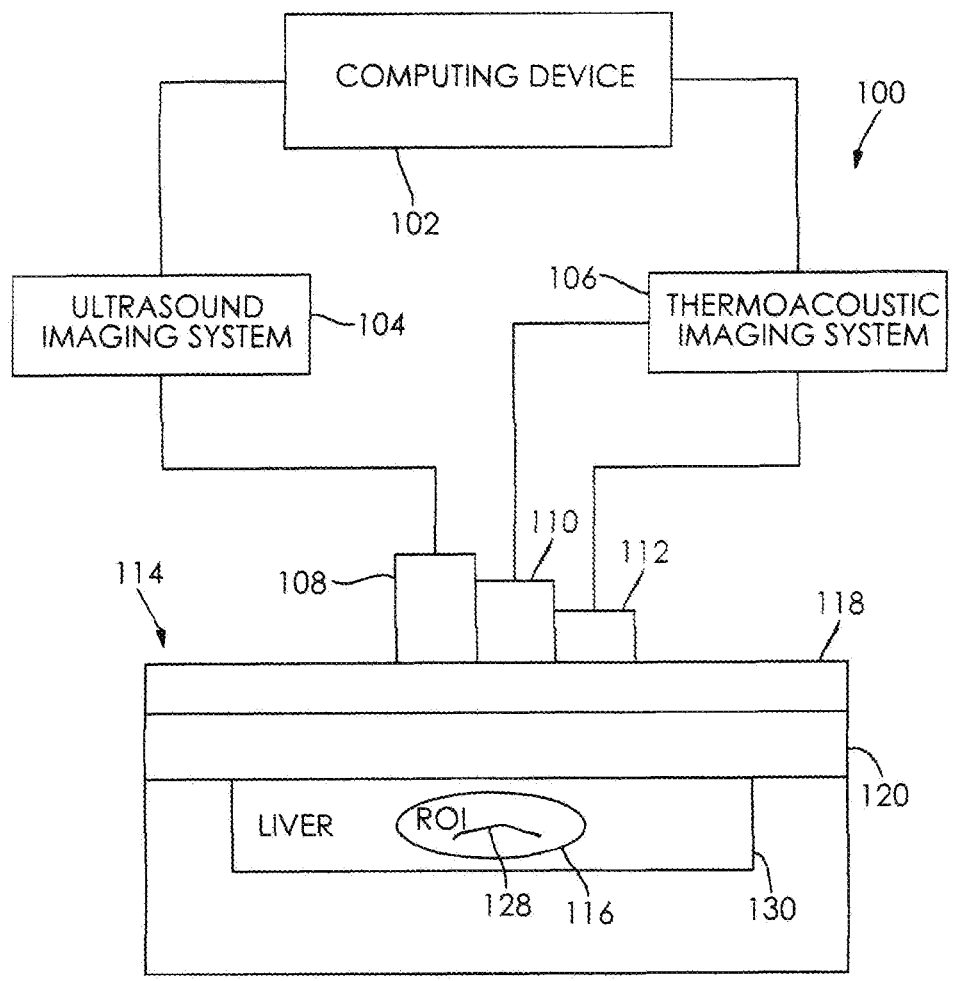
FIG. 1 is a schematic view of an imaging system, according to an embodiment.

The foregoing summary, as well as the following detailed description of certain examples will be better understood when read in conjunction with the appended drawings. As used herein, an element or feature introduced in the singular and preceded by the word "a" or "an" should be understood as not necessarily excluding the plural of the elements or features. Further, references to "one example" or "one embodiment" are not intended to be interpreted as excluding the existence of additional examples or embodiments that also incorporate the described elements or features. Moreover, unless explicitly stated to the contrary, examples or embodiments "comprising" or "having" or "including" an element or feature or a plurality of elements or features having a particular property may include additional elements or features not having that property. Also, it will be appreciated that the terms "comprises", "has", "includes" means "including but not limited to" and the terms "comprising", "having" and "including" have equivalent meanings.

As used herein, the term "and/or" can include any and all combinations of one or more of the associated listed elements or features.

It will be understood that when an element or feature is referred to as being "on", "attached" to, "connected" to, "coupled" with, "contacting", etc. another element or feature, that element or feature can be directly on, attached to, connected to, coupled with or contacting the other element or feature or intervening elements may also be present. In contrast, when an element or feature is referred to as being, for example, "directly on", "directly attached" to, "directly connected" to, "directly coupled" with or "directly contacting" another element of feature, there are no intervening elements or features present.

It will be understood that spatially relative terms, such as "under", "below", "lower", "over", "above", "upper", "front", "back" and the like, may be used herein for ease of description to describe the relationship of an element or feature to another element or feature as illustrated in the figures. The spatially relative terms can however, encompass different orientations in use or operation in addition to the orientation depicted in the figures.

The present disclosure discusses embodiments that aim to have the following advantages. First, the method may be inherently non-intrusive as there is no electromagnetic measurement device in the reactive near-field region of the antenna. Second, the method may not require a large anechoic chamber, which can be expensive and very large depending on the frequency of operation of the antenna. Third, the method may allow characterization of an antenna in a solid dielectric medium where it could be difficult to insert a measurement device.

Characterizing the electromagnetic field of an aperture antenna typically involves a combination of experimental measurements and computational simulations. While simulations may be heavily used to estimate the spatial distribution of the electromagnetic field, experimental measurements at a couple of discrete locations may be necessary for both calibration and verification of the simulated results.

Instead of limited measurements at a few discrete locations, full characterization at numerous points may provide a better tool for verification or calibration and can potentially eliminate the need for simulation.

Thermoacoustic imaging techniques generate an acoustic signal with amplitude proportional to the square magnitude of the electromagnetic field and thus contain information about its spatial distribution:

$$P_0(r) = \Gamma(r)\sigma(r)\|E(r)\|^2 \quad (1)$$

where $P_0$ is the thermoacoustic signal generated at a certain location r, $\Gamma$ is the medium Grüneisen parameter, $\sigma$ is the medium conductivity, and $\|E(r)\|$ is the electric field amplitude. Thus in theory, for a homogenous medium with a constant conductivity and a constant Grüneisen parameter, the pressure generated is proportional to the electric field amplitude and has the same spatial distribution.

Thermoacoustic methods cannot be directly utilized to estimate the electric field distribution because those techniques utilize acoustic sensors that act as band-pass filters, thus only allowing the reconstruction of abrupt changes in signal and not a smooth variation in the electromagnetic field. Thus, even under ideal reconstruction, the reconstructed pressure would be:

$$P_r(r) = P_0(r) * h(r) \quad (2)$$

where $P_r$ is the reconstructed pressure, h is the (DC-less) system's point spread function, and * denotes spatial convolution.

Because a system's impulse response removes the low-frequency contact from $P_0$ for a homogenous medium and a slowly varying electromagnetic field amplitude, the mean signal the system will receive is zero. Hence, the measured signal is mostly dominated by the system noise.

To overcome this limitation, the embodiments herein utilize the variance of a thermoacoustic signal across multiple repeated measurements in a liquid medium. As the conductivity and Grüneisen parameters vary from scan to scan due to Brownian motion, the fluctuations in reconstructed pressure between multiple consecutive scans can be used to image the entire spital frequency content of the E-field:

$$\text{Std}\{P_0(r)\} = \alpha(\Gamma(r)\sigma(r)\|E(r)\|^2) + N(r) \quad (3)$$

where $\alpha$ is a proportionality constant and N is the system noise. This approach may be used to identify different material properties.

Referring now to the drawings, wherein the depictions are for the purpose of illustrating certain embodiments only and not for the purpose of limiting the same, FIG. 1 schematically shows an example imaging system 100 is shown and is generally identified by reference numeral 100. As depicted, the imaging system 100 includes a programmed computing device 102 communicatively coupled to an ultrasound imaging system 104 and to a thermoacoustic imaging system 106. The ultrasound imaging system 104 and thermoacoustic imaging system 106 are configured to obtain ultrasound image data and thermoacoustic image data, respectively, of a region of interest 116. Components of the system 100 are shown in FIG. 1 as single elements. Such illustration is for ease of description, and it should be recognized that the system 100 may include multiple additional imaging devices or sub-devices.

The programmed computing device 102 may be a computer, server or other suitable processing device comprising, for example, a processing unit comprising one or more processors, computer-readable system memory (volatile and/or non-volatile memory), other non-removable or removable computer-readable memory (e.g., a hard disk drive, RAM, ROM, EEPROM, CD-ROM, DVD, flash memory, etc.) and a system bus coupling the various computer components to the processing unit. The computing device 102 may also comprise networking capabilities using Ethernet, Wi-Fi, and/or other suitable network format, to enable connection to shared or remote drives, one or more networked computers, or other networked devices. One or more input devices, such as a mouse and a keyboard (not shown) are coupled to the computing device 102 for receiving operator input. A display device (not shown), such as one or more computer screens or monitors, is coupled to the computing device 102 for displaying one or more generated images that are based on ultrasound image data received from the ultrasound imaging system 104 and/or the thermoacoustic image data received from thermoacoustic imaging system 106. The programmed computing device 102 executes program code stored on the computer-readable system memory and/or other non-removable or removable computer-readable memory and performs methods according to the program code as will be described further below.

The ultrasound imaging system 104 comprises an acoustic receiver in the form of an ultrasound transducer 108 that houses one or more ultrasound transducer arrays configured to emit sound waves into the region of interest 116. Sound waves directed into the region of interest 116 echo off materials within the region of interest 116, with different materials reflecting varying degrees of sound. Echoes that are received by the one or more ultrasound transducer arrays of the ultrasound transducer 108 may be processed by the ultrasound imaging system 104 before being communicated as ultrasound image data to the computing device 102 for further processing and for presentation on the display device as ultrasound images that can be interpreted by an operator. In one embodiment, the ultrasound imaging system 104 utilizes B-mode ultrasound imaging techniques assuming a nominal speed of sound of 1,540 m/s. As ultrasound imaging systems are known in the art, further specifics of the ultrasound imaging system 104 will not be described further herein.

The thermoacoustic imaging system 106 comprises an acoustic receiver in the form of a thermoacoustic transducer 110. The thermoacoustic transducer 110 houses one or more thermoacoustic transducer arrays. Radio-frequency (RF) applicator 112 may be housed together or separately from the thermoacoustic transducer 110. The RF applicator 112 is configured to emit short pulses of RF energy that are directed into the region of interest 116, which contains blood vessel 128. In one embodiment, the RF applicator 112 has a frequency between about 10 Mhz and 100 GHz and has a pulse duration between about 0.1 nanoseconds and 10 microseconds. RF energy pulses delivered to materials within the region of interest 116 induce acoustic pressure waves (thermoacoustic multi-polar signals) within the region of interest 116 that are detected by the thermoacoustic transducer 110. Acoustic pressure waves that are detected by the thermoacoustic transducer 110 are processed and communicated as thermoacoustic image data to the computing device 102 for further processing and for presentation on the display device as thermoacoustic images that can be interpreted by the operator.

The coordinate system of the one or more ultrasound transducer arrays of the ultrasound transducer 108 and the coordinate system of the one or more thermoacoustic transducer arrays of the thermoacoustic transducer 110 are mapped by the computing device 102 so that acquired ultrasound and thermoacoustic images can be registered. Alternatively, the thermoacoustic imaging system 106 may make use of the one or more ultrasound transducer arrays of the ultrasound transducer 108 by disconnecting the one or more ultrasound transducer arrays from the ultrasound transducer 108 and connecting the one or more ultrasound transducer arrays to the thermoacoustic transducer 110. As will be appreciated, by doing this coordinate mapping between the one or more ultrasound transducer arrays and the one or more thermoacoustic transducer arrays is not required.

In one embodiment, as depicted in FIG. 1, an example of the region of interest 116 contains a blood vessel 128 and is located within a liver 130 of a human or animal body (patient) 114. Patient 114 comprises a skin and subcutaneous fat layer 118 and muscle layer 120 adjacent to liver 130. In a separate embodiment, blood vessel 128 functions as a reference and liver tissue located with the region of interest 116 functions as an object of interest.

Figure 2:
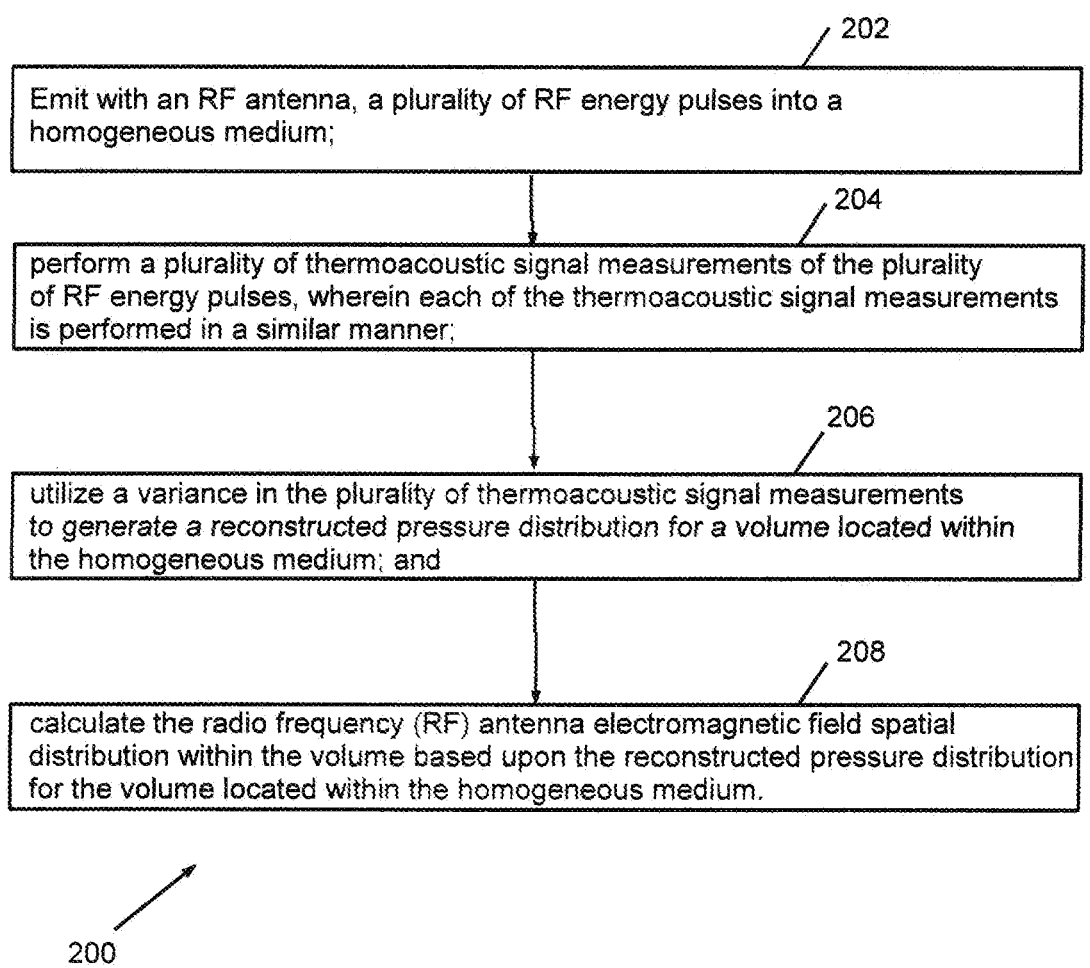
FIG. 2 shows the steps of a method, according to an embodiment.

FIG. 2 shows the steps of an illustrative method 200 for determining an electromagnetic field spatial distribution of a radio frequency (RF) antenna. The method 200 may include more or fewer operations than shown. The operations shown may be performed in the order shown, in a different order, or concurrently. The method 200 may be performed by the computing device 102, ultrasound imaging system 104, thermoacoustic imaging system 106 of FIG. 1, or a combination of more than one of these components. Additionally, or alternatively, one or more operations involved in performing the method 200 may be performed by a device different from, or in coordination with, the computing device 102, ultrasound imaging system 104, thermoacoustic imaging system 106. The method may be performed using a non-transitory machine-readable storage medium having computer-executable instructions stored thereon that, when executed by one or more processors, cause the one or more processors to perform the steps described below.

In step 202, the system emits, using the RF antenna, a plurality of RF energy pulses into a homogeneous medium. The RF antenna may have a frequency between about 10 Mhz and 100 GHz and has a pulse duration between about 0.1 nanoseconds and 10 microseconds.

In step 204, the system performs a plurality of thermoacoustic signal measurements of the plurality of RF energy pulses, wherein each of the thermoacoustic signal measurements is performed in a similar manner. An acoustic sensor may not be sensitive to low frequencies, so the acoustic sensor may not be capable of identifying slow changes or trends. Utilizing one measurement or even a mean of similar measurements may not identify the slow trends. Rather than conducting limited measurements at a few discrete locations, whereby the mean signal at those locations will be zero and mostly noise may be detected at those locations, the system performs multiple and repeated thermoacoustic signal measurements. The variance of the noise is a useful measurement to see slow and abrupt changes using variance rather than the mean. The noise is proportional to a pressure distribution and the electromagnetic field. More noise and more pressure variation corresponds to more electromagnetic field, and less noise and less pressure variation corresponds to less electromagnetic field.

Figure 3A:
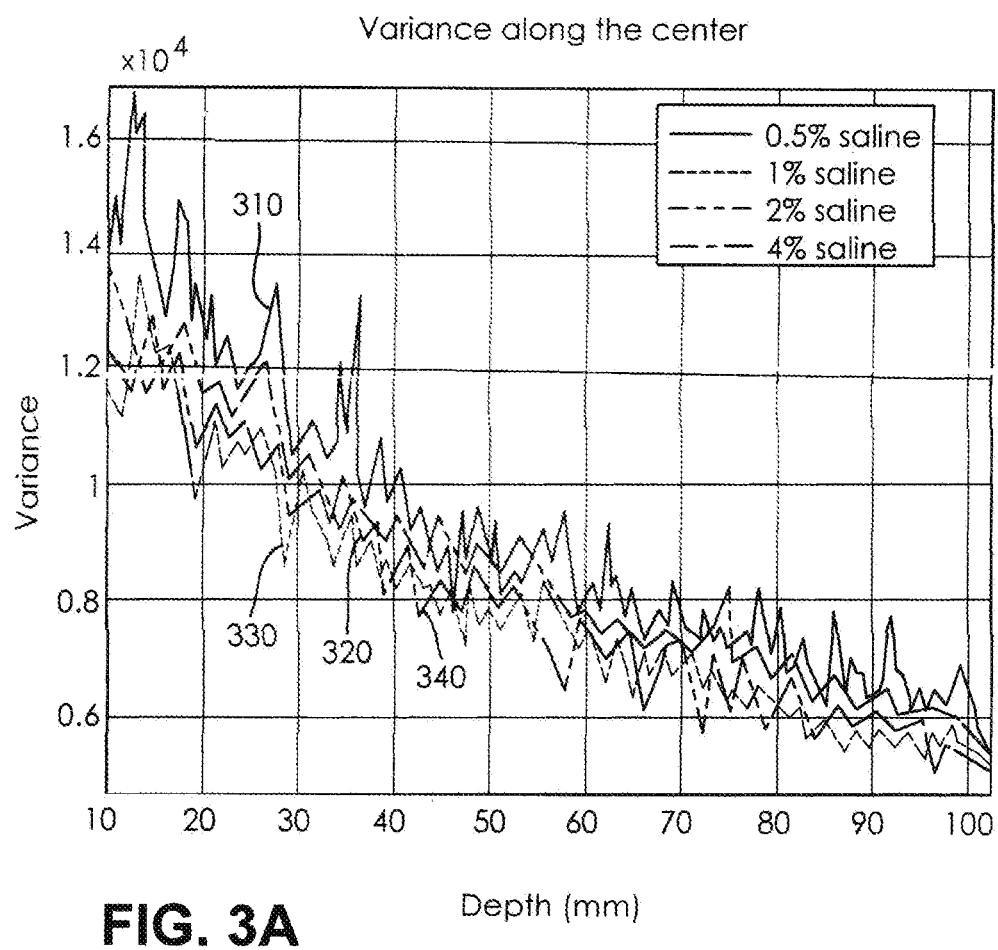
FIGS. 3A and 3B show variances in pressure from a center, according to an embodiment.
Figure 3B:
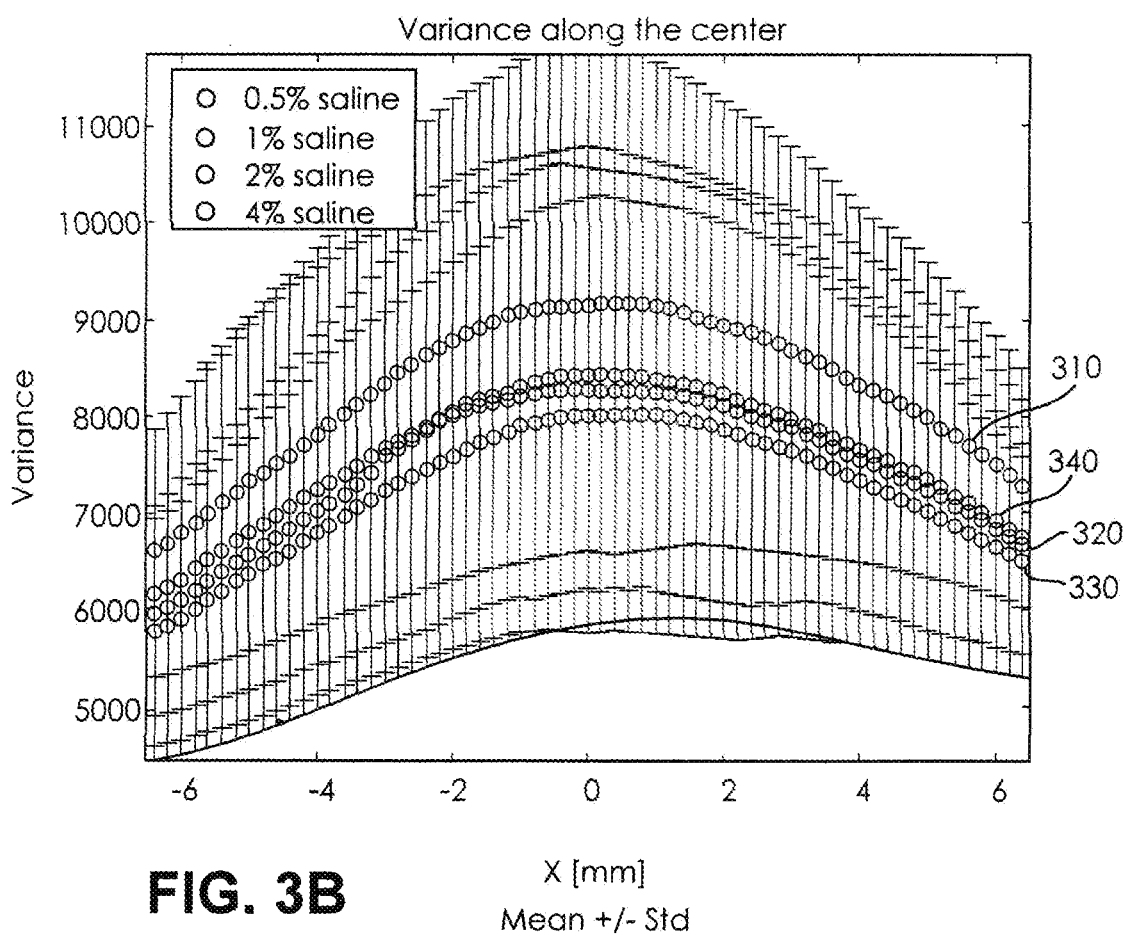

Referring to FIGS. 3A and 3B, variances in pressure from a center are shown. In this particular example, different vials of a homogeneous saline solution were tested, including 0.5% saline 310, 1% saline 320, 2% saline 330, and 4% saline 340. In FIG. 3A, the y-axis represents variance in pressure (in arbitrary digital units) and the x-axis represents a depth from a top of the vial. In FIG. 3B, the y-axis represents variance in pressure (in arbitrary digital units) and the x-axis represents a distance from the center along the width, e.g., along the diameter of the vial.

In step 206, the system generates a reconstructed pressure distribution for a volume located within the homogeneous medium by utilizing a variance in the plurality of thermoacoustic signal measurements. The reconstructed pressure distribution may be based on Equation 2 above.

In step 208, the system calculates the RF antenna electromagnetic field spatial distribution within the volume based upon the reconstructed pressure distribution for the volume located within the homogeneous medium. This calculation may be represented by Equation 3 above.

The system can output data from the calculation or a visual representation of the calculation, which may be presented for display on a user interface of a computing device, such as computing device 102 of FIG. 1. The visual representation may be depicted in two dimensions or three dimensions. The selection of the output format may be based upon the desired purpose of the calculation.

Figure 4:
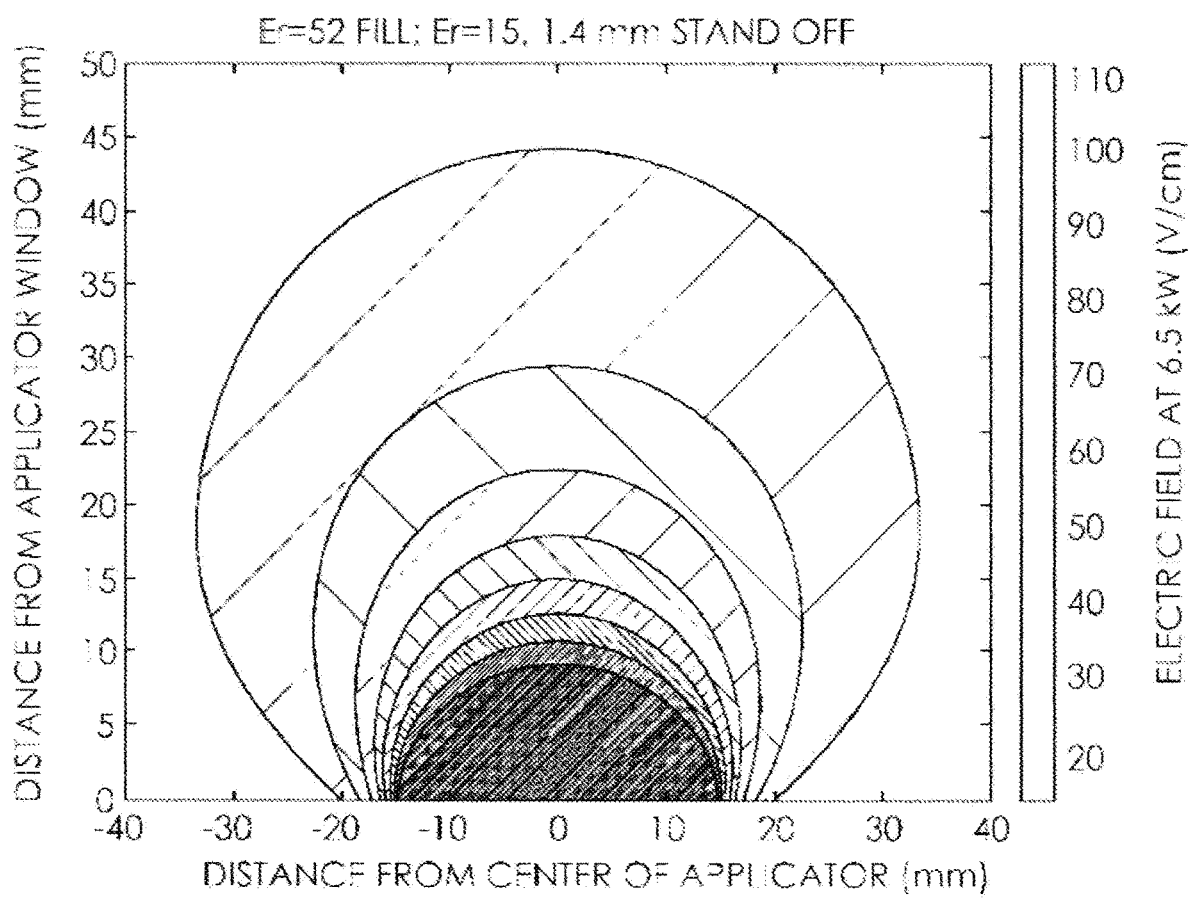
FIG. 4 shows an energy gradient of an RF energy pulse, according to an embodiment.

In one example, the output may be a two dimensional representation of the spatial distribution of the electromagnetic field. FIG. 4 illustrates an energy gradient of an RF energy pulse generated by the RF antenna as it exits a window of a waveguide. The window is located and centered at the 0 value of the x-axis. As can be seen, as the distance from the center of the RF antenna increases, the electric field strength decreases. As such, adjusting the distance between the RF antenna and the tissue can help to enhance energy delivery during thermoacoustic imaging. FIG. 4 is an example of an output displayed on a user interface, though it is not intended that the output is limited to this format or arrangement of data.

The output may be used for various applications. In one example, the output may be used for validation, such as designing an antenna and confirming that it delivers power in a direction that it was designed to deliver the power. It may be desirable to use a two or three dimensional visual representation for this purpose. In another example, the output may be used for regulatory purposes, such as use in the medical field where there may be a limit to use of an electromagnetic field. In some instances, the decay may be compared to the regulatory limits. It may be desirable to use a data output here to determine if any of the data exceeds the regulatory threshold. An alert or notification may indicate that the output exceeds the threshold in at least one instance. Alternatively, a visual indicator may display the data that exceeds the threshold in a different format to be visually distinct from other data. In yet another example, the output may be used for design, whereby the system here can be used to test a designed element and it may be difficult to measure an actual electromagnetic field distribution. It may be desirable to use a two or three dimensional visual representation for this purpose.

Although embodiments have been described above with reference to the accompanying drawings, those of skill in the art will appreciate that variations and modifications may be made without departing from the scope thereof as defined by the appended claims.

What is claimed is:

1. A method for determining an electromagnetic field spatial distribution of a radio frequency (RF) antenna, the method comprising:
   (i) emitting, by the RF antenna, a plurality of RF energy pulses into a homogeneous medium;
   (ii) performing, by at least one processor, a plurality of thermoacoustic signal measurements of the plurality of RF energy pulses, wherein each of the thermoacoustic signal measurements is performed in a similar manner;
   (iii) generating, by the at least one processor, a reconstructed pressure distribution for a volume located within the homogeneous medium using a variance in the plurality of thermoacoustic signal measurements; and
   (iv) generating, by the at least one processor, a representation of the RF antenna electromagnetic field spatial distribution within the volume based upon a calculation using the reconstructed pressure distribution for the volume located within the homogeneous medium.

2. The method of claim 1, wherein the plurality of thermoacoustic signal measurements is performed with a thermoacoustic system comprising the RF antenna and one or more thermoacoustic transducers.

3. The method of claim 1, wherein the representation is a two dimensional or three dimensional visual representation of the RF antenna electromagnetic field spatial distribution.

4. The method of claim 1, wherein the homogeneous medium is a liquid.

5. The method of claim 4, wherein the liquid is water.

6. The method of claim 1, wherein the homogenous medium has a relative permittivity between 10 and 70.

7. The method of claim 1, wherein the homogeneous medium is a solid.

8. A system for determining an electromagnetic field spatial distribution of a radio frequency (RF) antenna, the system comprising:
   an RF antenna configured to emit a plurality of RF energy pulses into a homogeneous medium;
   at least one processor configured to:
      perform a plurality of thermoacoustic signal measurements of the plurality of RF energy pulses, wherein each of the thermoacoustic signal measurements is performed in a similar manner;
      generate a reconstructed pressure distribution for a volume located within the homogeneous medium using a variance in the plurality of thermoacoustic signal measurements; and
      generate a representation of the RF antenna electromagnetic field spatial distribution within the volume based upon a calculation using the reconstructed pressure distribution for the volume located within the homogeneous medium.

9. The system of claim 8, further comprising one or more thermoacoustic transducers.

10. The system of claim 8, wherein the representation is a two dimensional or three dimensional visual representation of the RF antenna electromagnetic field spatial distribution.

11. The system of claim 8, wherein the homogeneous medium is a liquid.

12. The system of claim 11, wherein the liquid is water.

13. The system of claim 8, wherein the homogenous medium has a relative permittivity between 10 and 70.

14. The system of claim 8, wherein the homogeneous medium is a solid.

15. A non-transitory machine-readable storage medium having computer-executable instructions stored thereon that, when executed by one or more processors, cause the one or more processors to perform operations comprising:
   performing, by at least one processor, a plurality of thermoacoustic signal measurements of a plurality of RF energy pulses emitted by an RF antenna, wherein each of the thermoacoustic signal measurements is performed in a similar manner;

generating, by the at least one processor, a reconstructed pressure distribution for a volume located within a homogeneous medium using a variance in the plurality of thermoacoustic signal measurements; and generating, by the at least one processor, a representation of a RF antenna electromagnetic field spatial distribution within the volume based upon a calculation using the reconstructed pressure distribution for the volume located within the homogeneous medium.

16. The non-transitory machine-readable storage medium of claim 15, wherein the plurality of thermoacoustic signal measurements is performed with a thermoacoustic system comprising the non-transitory machine-readable storage medium, the RF antenna, and one or more thermoacoustic transducers.

17. The non-transitory machine-readable storage medium of claim 15, wherein the representation is a two dimensional or three dimensional visual representation of the RF antenna electromagnetic field spatial distribution.

18. The non-transitory machine-readable storage medium of claim 15, wherein the homogeneous medium is a liquid.

19. The non-transitory machine-readable storage medium of claim 15, wherein the homogenous medium has a relative permittivity between 10 and 70.

20. The non-transitory machine-readable storage medium of claim 15, wherein the homogeneous medium is a solid.

* * * * *